(12) United States Patent  (10) Patent No.: US 7,596,020 B2
Nakagawa et al.  (45) Date of Patent: Sep. 29, 2009

(54) MULTI-LEVEL NONVOLATILE SEMICONDUCTOR MEMORY DEVICE CAPABLE OF DISCRETELY CONTROLLING A CHARGE STORAGE LAYER POTENTIAL BASED UPON ACCUMULATED ELECTRONS

(75) Inventors: Michio Nakagawa, Kanagawa-ken (JP); Koji Sakui, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 214 days.

(21) Appl. No.: 11/461,207

(22) Filed: Jul. 31, 2006

(65) Prior Publication Data

US 2007/0035996 A1  Feb. 15, 2007

(30) Foreign Application Priority Data

Aug. 1, 2005  (JP)  ............................. 2005-222699

(51) Int. Cl.
*G11C 16/04*  (2006.01)
(52) U.S. Cl. ...................... 365/185.03; 365/185.17; 365/185.18
(58) Field of Classification Search ............ 365/185.03, 365/185.17, 185.18
See application file for complete search history.

(56) References Cited

U.S. PATENT DOCUMENTS

| | | | |
|---|---|---|---|
| 5,555,204 A | 9/1996 | Endoh et al. | |
| 5,774,397 A | 6/1998 | Endoh et al. | |
| 5,946,231 A | 8/1999 | Endoh et al. | |
| 6,014,330 A | 1/2000 | Endoh et al. | |
| 6,069,380 A * | 5/2000 | Chou et al. | ................. 257/315 |
| 6,188,611 B1 | 2/2001 | Endoh et al. | |
| 6,320,792 B1 * | 11/2001 | Caser et al. | ............ 365/185.23 |
| 6,507,521 B2 * | 1/2003 | Kurachi | ................. 365/185.28 |
| 6,728,140 B2 * | 4/2004 | Han et al. | ............. 365/185.24 |

FOREIGN PATENT DOCUMENTS

| | | |
|---|---|---|
| JP | 7-169284 | 7/1995 |
| WO | WO 2006/082914 A1 | 8/2006 |

* cited by examiner

*Primary Examiner*—Andrew Q Tran
(74) *Attorney, Agent, or Firm*—Oblon, Spivak, McClelland, Maier & Neustadt, L.L.P.

(57) ABSTRACT

A multi-level programmable nonvolatile semiconductor memory device comprises, a charge accumulation layer, a control gate which bias a potential to the charge accumulation layer, wherein the potential of the charge accumulation layer is controlled discretely according to the number of electrons accumulated in the charge accumulation layer.

8 Claims, 10 Drawing Sheets

F I G. 1A

F I G. 1B

| | | 0.69 | 0.79 | 0.79 | 0.7 | 0.7 | 0.7 |
|---|---|---|---|---|---|---|---|
| shrink rate | | | | | | | |
| Generation | 130nm | 90nm | 70nm | 55nm | 4Xnm | 2Xnm | 1Xnm |
| Cell W/L [μm/μm] | 0.10/0.13 | 0.1/0.09 | 0.071/0.071 | 0.056/0.056 | 0.040/0.040 | 0.028/0.028 | 0.019/0.019 |
| Cell Area Size [μm^2] | 0.013000 | 0.009000 | 0.005041 | 0.003136 | 0.001600 | 0.000784 | 0.000361 |
| Cono (Ratio=0.5, Tox=8.2nm) [fF] | 0.0547 | 0.0379 | 0.0212 | 0.0132 | 0.0067 | 0.0033 | 0.0015 |
| Itunnel (@VPGM=20V) [pA] | 12.194 | 8.442 | 4.729 | 2.942 | 1.501 | 0.735 | 0.339 |
| Tprog (@ΔVth=1V, VPGM=20V) [μs] | 4.49 | 4.49 | 4.49 | 4.49 | 4.49 | 4.49 | 4.49 |
| Number of Electron (@ΔVth=1V) | 342 | 237 | 132 | 82 | 42 | 21 | 9 |
| Number of Electron (@ΔVth=6V) | 2050 | 1419 | 795 | 494 | 252 | 124 | 57 |
| ΔVth/electron [mV] | 2.9 | 4.2 | 7.5 | 12.1 | 23.8 | 48.5 | 105.4 |

MULTI-LEVEL NONVOLATILE SEMICONDUCTOR MEMORY DEVICE CAPABLE OF DISCRETELY CONTROLLING A CHARGE STORAGE LAYER POTENTIAL BASED UPON ACCUMULATED ELECTRONS

CROSS-REFERENCE TO RELATED APPLICATIONS

This application is based upon and claims the benefit of priority from prior Japanese Patent Application No. 2005-222699, filed Aug. 1, 2005, the entire contents of which are incorporated herein by reference.

PCT/JP2006/301834 and U.S. Pat. No. 6,188,611 are also incorporated herein by reference.

BACKGROUND OF THE INVENTION

1. Field of the Invention

This invention relates to an electrically rewritable and nonvolatile semiconductor memory device and the method of operating the same. It is further related to a nonvolatile semiconductor memory device, such as NAND cell type, NOR cell type, DINOR cell type, and AND cell type EEPROM.

2. Description of the Related Art

An electrically erasable and programmable EEPROM, such as a NAND cell-type EEPROM that configures a NAND cell with a plurality of serially connected memory cells, has been known as one of semiconductor memory devices. A memory cell in the NAND cell-type EEPROM has a FET-MOS structure with a charge storage layer (floating gate) and a control gate stacked on a semiconductor substrate. The memory cell stores data "0" or "1" depending on the amount of charge accumulated in the floating gate.

For market expansion of a semiconductor memory device, high integration of a semiconductor memory device and the reduction in cost are required. Data programming of an NAND type flash memory is performed sequentially from the memory cell which is most separated from a bit line. Under the data programming, 0V ("0" data programming) or supply voltage Vcc ("1" data programming) is applied to a bit line according to program data.

Vcc is given to the selected bit-line side selection gate line.

When a bit line is 0V, at the connected selected NAND cell, the potential is fixed to 0V through a selection gate transistor.

When a bit line is biased at Vcc, selected NAND cell is charged to Vcc−Vtsg through a selection gate transistor. Here, Vtsg is the threshold voltage of a selection gate transistor. Then, the control gate line of the selected NAND cell is set to Vpp (about 20V, program voltage) from 0V. Further, the control gate line of non-selected memory cell in the selected NAND cell is set to Vmg (about 10V: middle voltage) from 0V. Here, in selected NAND cell, when the bit line was 0V, the channel part of the NAND cell is fixed to 0V.

A potential difference (about 20V) occurs between the gate (Vpp potential) and channel part (0V) of the selected NAND cell, and electron injection occurs from the channel part to the floating gate. Then the threshold voltage of the selected NAND cell shifts in the positive direction. This state is data "0."

On the other hand, when the bit line is biased at Vcc, the channel part of the selected NAND cell is in a floating state. For this reason, with a voltage rise from 0V to Vpp or Vmg of the control gate line of the selected NAND cell, and since the control gate line is under the influence of capacitive coupling between channel parts, a channel potential goes up from Vcc−Vtsg to Vmch (about 8V), while the potential of a channel part had maintained the floating state.

At this time, the potential difference between the gate (Vpp potential) of the selected NAND cell and channel parts (Vmch) are comparatively as small as about 12V. So an electron injection does not occur. Therefore, Vth (threshold voltage) of the selected NAND cell does not change but is maintained at the negative state. This state is data "1."

Data erasure of an NAND type flash memory is simultaneously performed to all the NAND cells in the selected NAND cell block. First, all control gates in the selected NAND cell block are set to 0V. The control gates, all the selection gates in non-selected NAND cell blocks, the bit line, and the source line, are set floating. A high voltage of about 20V is biased to the p type well. Thereby, in all of the NAND cells in the selected NAND cell block, the electrons in the floating gate are emitted to the p type well, and the threshold voltage is shifted in the negative direction. Thus, in an NAND cell type flash memory, data erasure will be performed per block.

SUMMARY OF THE INVENTION

A nonvolatile semiconductor memory device based on first aspect of the invention comprises, a charge accumulation layer; a control gate which bias a potential to the charge accumulation layer, wherein the potential of the charge accumulation layer is controlled discretely according to the number of electrons accumulated in the charge accumulation layer.

DETAILED DESCRIPTION OF THE INVENTION

Hereafter, an embodiment of this invention is explained referring to drawings.

Introduction to the Invention

In a NAND cell type EEPROM, program voltage Vpp at the time of program is set constant. In early stages of programming, when the quantity of the electrons in a charge-storage layer is comparatively small, change of the threshold voltage of a memory cell is quick. In later stages of programming, when the quantity of the electrons in a charge-storage layer is comparatively large, change of the threshold voltage of a memory cell is slow. Moreover, in the early stage of programming, the electric field impressed to the insulated film, with which a tunnel current flows, is strong. The electric field is weak in the later stage of program.

For this reason, if the program voltage Vpp is raised in order to make program speed quick, the maximum threshold voltage after program will become high. Moreover, the distribution width of threshold voltage after program becomes large. Also, the electric field impressed to the insulated film, with which a tunnel current flows, becomes strong. This may result in poor reliability.

On the contrary, program speed will become slow, if Vpp is lowered in order to obtain a narrow threshold voltage distribution width after programming. In other words, a program voltage margin is narrow.

It is desirable to make the form of a program pulse into "an ideal trapezoidal-shape wave" at the time of program. However, it is difficult to carry the program pulse generator which generates "an ideal trapezoidal-shape wave" on the same chip as a memory array on account of a program pulse generator. Moreover, it is possible by making the interval of the program pulse of a stair-like wave small to bring the form of a program pulse close to "an ideal trapezoidal-shape wave." As a result, the number of times of verification will increase, and program and blanking time will increase as the result.

The inventors disclosed the program method (henceforth "stepping-up method") technology which can shorten program time. This method uses a series of a program pulses, the potential of a program pulse gradually stepped up by a width delta Vpp. As a result, by performing a program operation, program speed was improved.

By using the stepping-up method, it is possible to prevent a steep electric field impression to a memory cell, which can prevent causing degradation or breakdown, of a tunnel oxide film. The reliability of a nonvolatile semiconductor memory device can be improved.

On the other hand, the inventors examined what kind of influence appears in program operation as the design rule became small.

The semiconductor memory device and method of operating the same regarding to the first embodiment of this invention is explained using FIG. 1A to FIG. 10. The first embodiment is directed to a nonvolatile semiconductor memory device and method of operating the same.

Figure 1A:
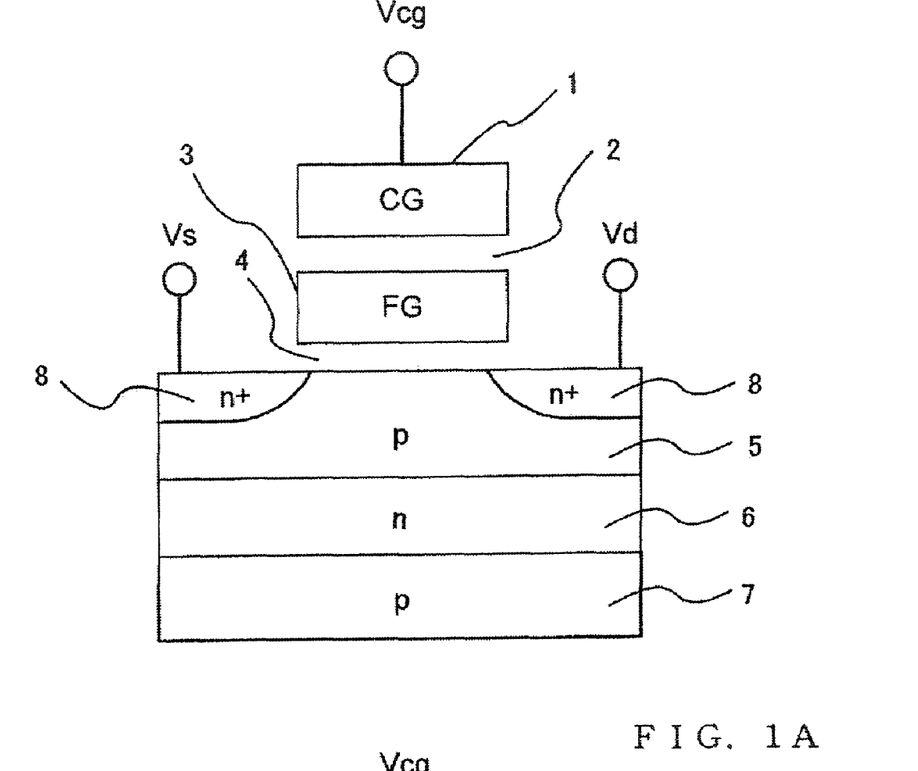
FIG. 1A is a figure showing the structure of a memory cell which was used for the simulation.
Figure 1B:
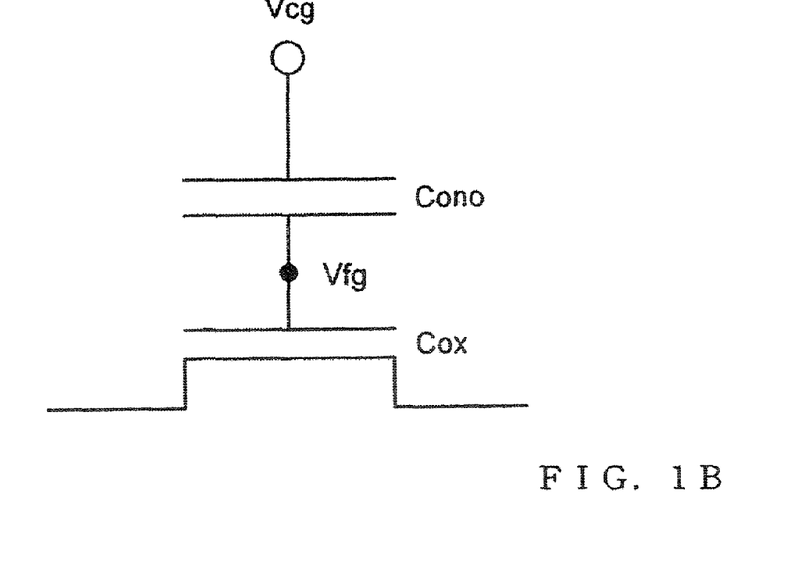
FIG. 1B is a figure showing the equivalent circuit of a memory cell which was used for the simulation.

The structure of the memory cell used for examination is shown in FIG. 1A, and the equivalent circuit figure of the structure is shown in FIG. 1B. As for the memory cell shown in FIG. 1A, a floating gate (FG, charge-storage layer) 3 and control gate (CG) 1 are formed on P-type silicon substrate 7/$n$ type well 6/$p$ type well 5.

P type well 5 and floating gate 3 are insulated by a tunnel oxide film 4. Floating gate 3 and control gate 1 are insulated by an insulator layer (stacked layer of an silicon oxide film/silicon nitride film/silicon oxide film) 2. N type diffusion layer 8 forms a source and a drain of a memory cell.

As shown in FIG. 1B, the capacity between floating gate 3 and control gate 1 is named as Cono, and the capacity between floating gate 3 and p type well 5 is named as Cox. In addition, since it is negligibly small compared with Cono and Cox, the capacity between floating gate 3 and n type diffusion layer 8 is not taken into consideration here.

A memory cell memorizes data with the electric charge stored in floating gate 3. The threshold voltage (Vth) of a memory cell is determined by the amount of electric charges stored in floating gate 3. The amount of electric charges which enters floating gate at the time of data program/erasure is controlled by FN tunnel-current (Fowler-Nordheim current) Itunnel which passes through the tunnel oxide film 4.

If the potential of control gate 1 is sufficiently high compared to the potential of p type well 5 and n type diffusion layer 8, electrons enter into floating gate 3 through the tunnel oxide film 4, and the threshold voltage Vth of a memory cell will become high. On the other hand, if the potential of p type well 5 and n type diffusion layer 8 is made high compared to the potential of control gate 1, electrons will be emitted from floating gate 3 through the tunnel oxide film 4, and the threshold Vth of a memory cell will become low.

Figure 2:
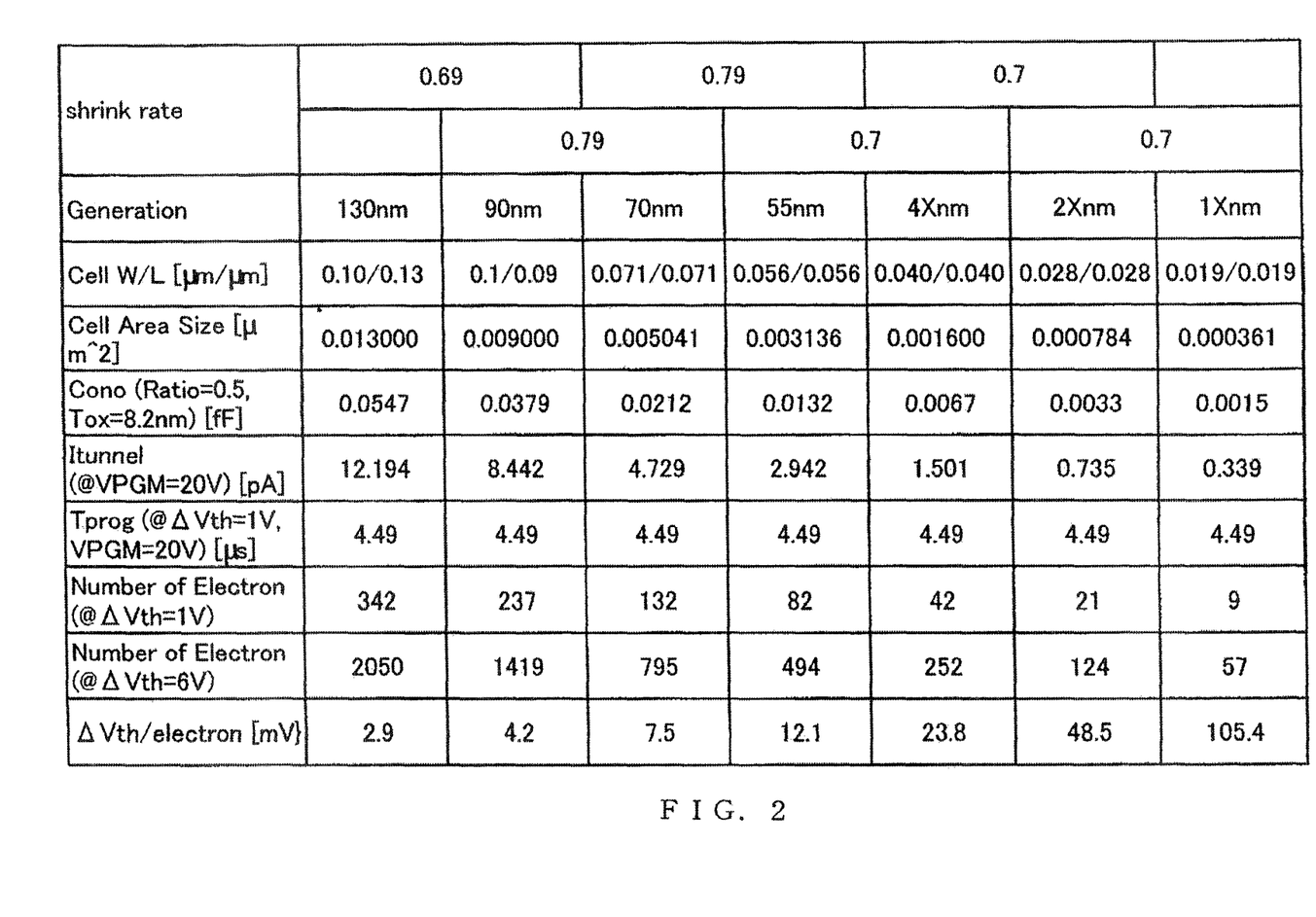
FIG. 2 is a figure showing the result of the simulation using the memory cell shown FIG. 1A and FIG. 1B.

Here, the result of the simulation of tunnel-current (Itunnel), the program time (Tprog) etc., when changing a design rule (generation) from 130 nm to Xnm, is shown in FIG. 2 using the memory cell shown in FIG. 1. In addition, "4X", "3X", "2X", and "1X" show the design rule of the level of 40 nm, the level of 30 nm, the level of 20 nm, and the level of 10 nm, respectively.

The capacitance Cono (where coupling ratio is 0.5) of the insulator layer between control gate and floating gate, the channel width/channel lengths of a memory cell (Cell W/L), the area (Cell Area Size) of the active layer of a memory cell, are shown in FIG. 2. Moreover, in FIG. 2, program time (Tprog) is the time taken to set delta Vth (Vth shift) of a threshold voltage to 1V, when the program voltage VPGM is 20V. Itunnel is a tunnel current in case the program voltage VPGM is 20V. In FIG. 2, the number of electrons (Number of Electron) shows the number of electrons which flowed into the floating gate needed to change a threshold voltage by 1V. Threshold voltage change/electron number (deltaVth/electron) shows the change of the threshold voltage by one electron entering the floating gate.

In addition, in the upper part of FIG. 2, the shrink rate of between each design rule is shown, and the shrink rate was calculated as 0.7 after 55 nm generation. According to the simulation result shown in FIG. 2, the number of electrons, which flowed into floating gate to change the threshold voltage by 1V decreases as a design rule becomes small. It decreases from 342, to 237, 132, . . . , as the number of electrons flowed into the floating gate needed to change the threshold voltage by 1V by design rule from 130 nm to 90 nm, 70 nm, . . . , respectively.

When in design rule 1Xnm, the number of the electrons which flowed into the floating gate needed to change the threshold voltage by 1V becomes only nine. By calculating the reciprocal of the electron number flowed into floating gate which is necessary to change the threshold voltage by 1V, on the other hand, change of deltaVth/electron of the threshold by one electron flowing into the floating gate can be estimated.

Figure 3:
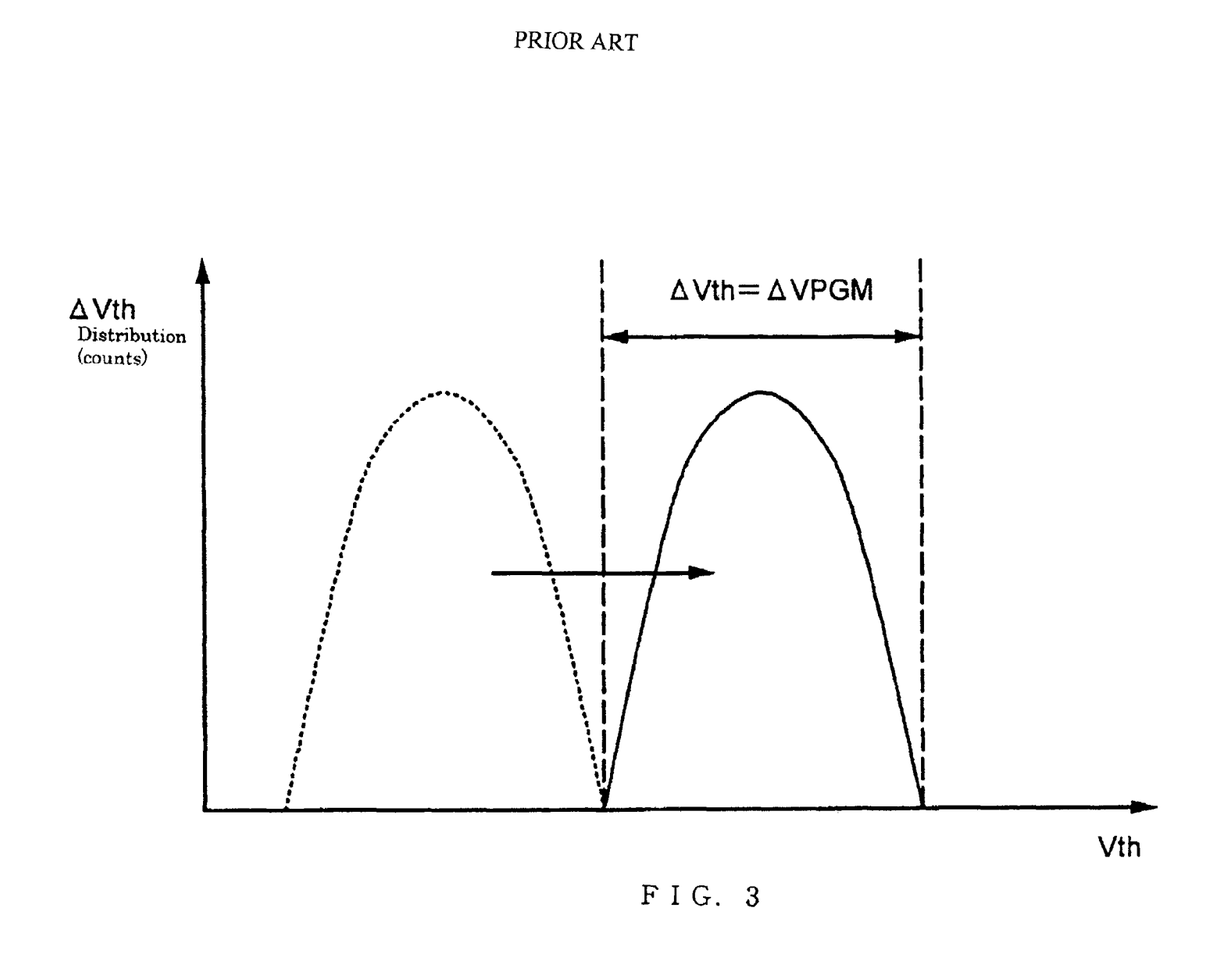
FIG. 3 is a plane view showing change of the threshold Vth of the conventional memory cell.

The threshold voltage change by one electron flowing into the floating gate is estimated from 2.9 mV, to 4.2 mV, 7.5 mV, . . . , according to the change of design rule from 130 nm, to 90 nm, 70 nm . . . . And by 1Xnm, the threshold voltage change will be calculated to about 100 mV per electron. In the case of the 70 nm design rule, deltaVth/electron is 7.5 mV/electron. The change of the threshold voltage of delta Vth, which is equivalent to delta Vpp (Vpgm), as shown in FIG. 3, can be found from the above simulation result by setting the step-up width deltaVpp as 7.5 mV.

In the case of design rule 1Xnm, deltaVth/electron is about 100 mV, as compared with the case where a design rule is loose, change of the threshold per electron is large, and in using the stepping-up method, it is necessary to set the deltaVPGM>100 mV. In other words, in design rule 1Xnm, a big change of threshold voltage can be produced by one electron flowing into the floating gate.

Figure 4A:
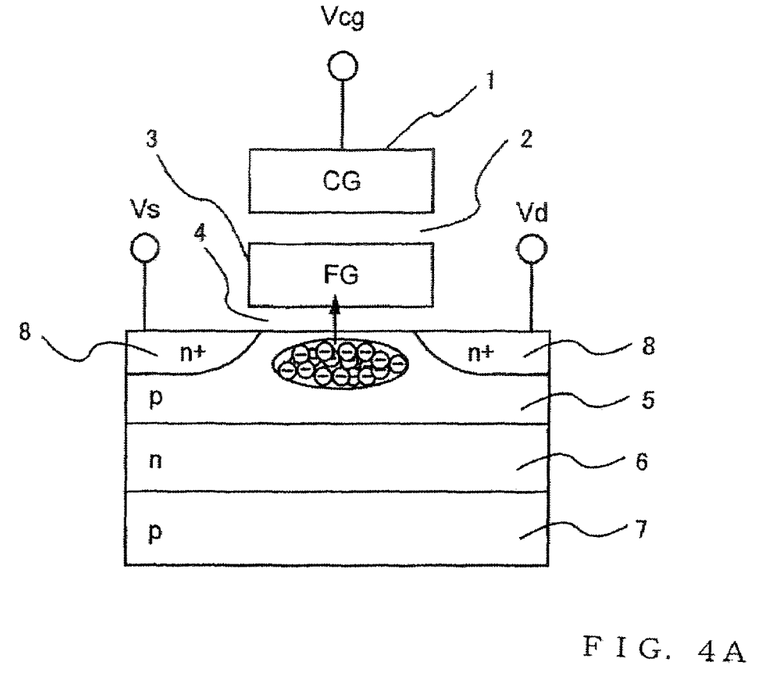
FIG. 4A shows the image of electrons traveling to the floating gate when a design rule is loose.
Figure 4B:
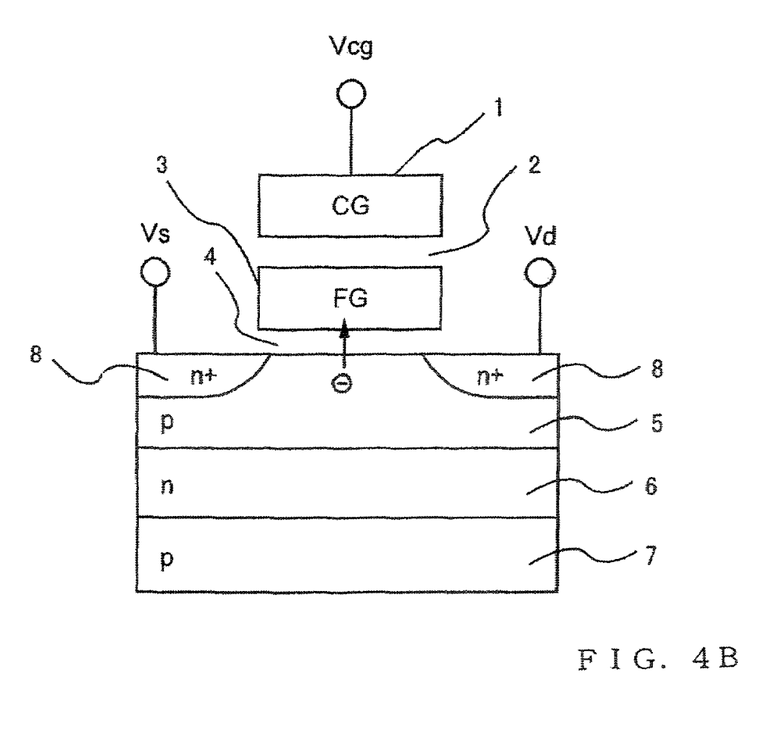
FIG. 4B shows the image of electrons traveling to the floating gate when a design rule is 1Xnm.
Figure 5:
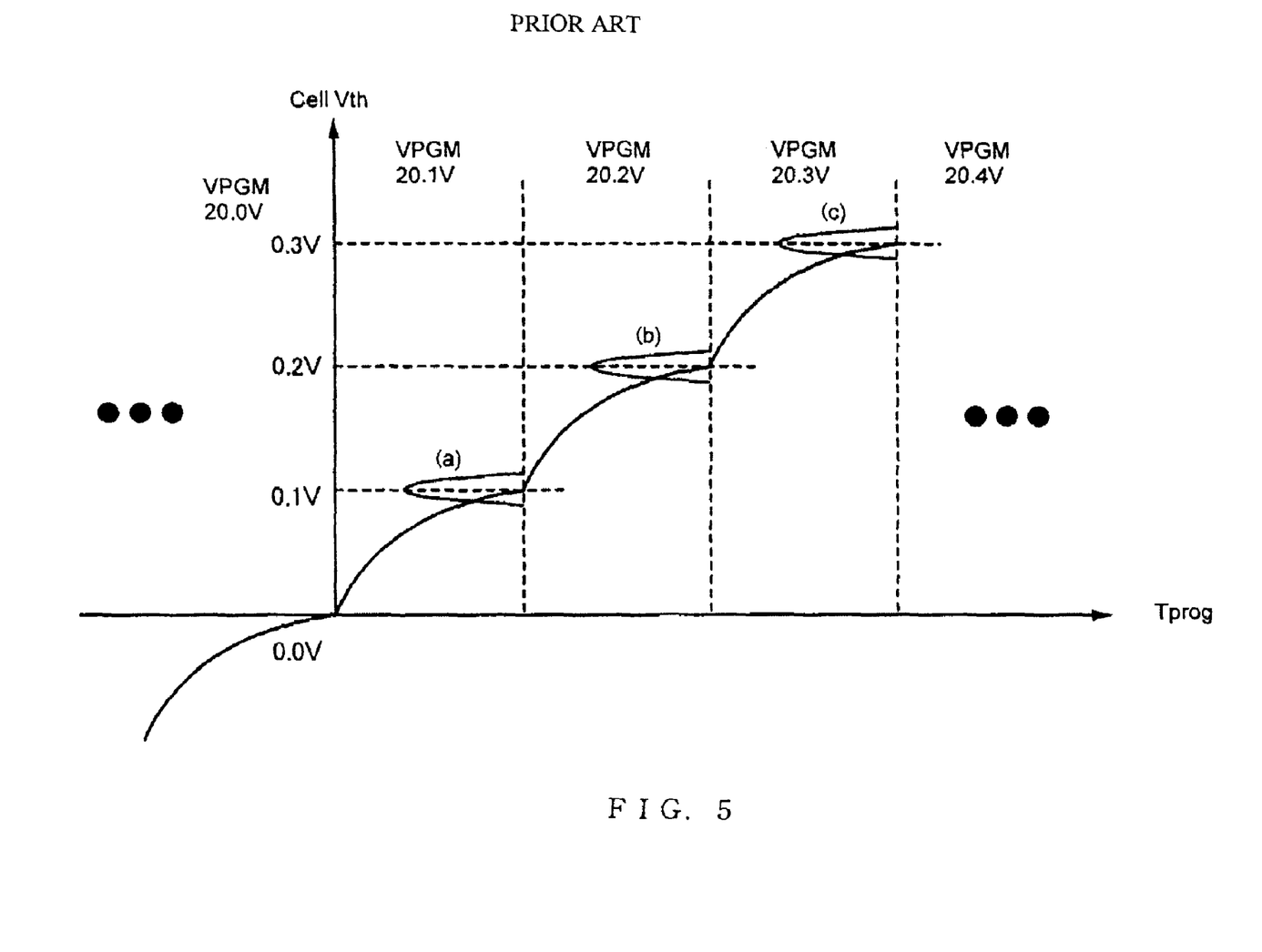
FIG. 5 is a figure showing change of the threshold Vth of the conventional memory cell.

When a design rule is loose, as shown in FIG. 4A, a threshold voltage change deltaVth=100 mV is produced by flowing a lot of electrons (being 13 in the case of for example, design rule 70 nm) into the floating gate, although, when a design rule is 1Xnm as shown in FIG. 5 (b), threshold voltage change deltaVth=100 mV can be produced by one electron.

In the simulation result shown in FIG. 2, in the case of design rule 70 nm, in order to fluctuate 0.1V threshold, it is necessary to flow 13 electrons into the floating gate. By one program pulse (VPGM), the threshold voltage Vth of a memory cell changes 0.1V, as it is shown in (a), (b), and (c) of FIG. 5, when program operation is performed by the stepping-up method in the case of design rule 70 nm, and the step-up width (deltaVpp) of a program pulse (VPGM) is 0.1V. Here, when 13 electrons should flow into floating gate by one program pulse, for example, if 12 electrons, or 14 electrons, might flow into the floating gate, ±7.5 mV variation will arise in the threshold Vth of a memory cell, and the threshold distribution of a memory cell will spread. If the program pulse VPGM is impressed one after another, by adding the step-up width deltaVpp, the threshold distribution of a memory cell will spread having 7.5 mV variation.

Figure 6:
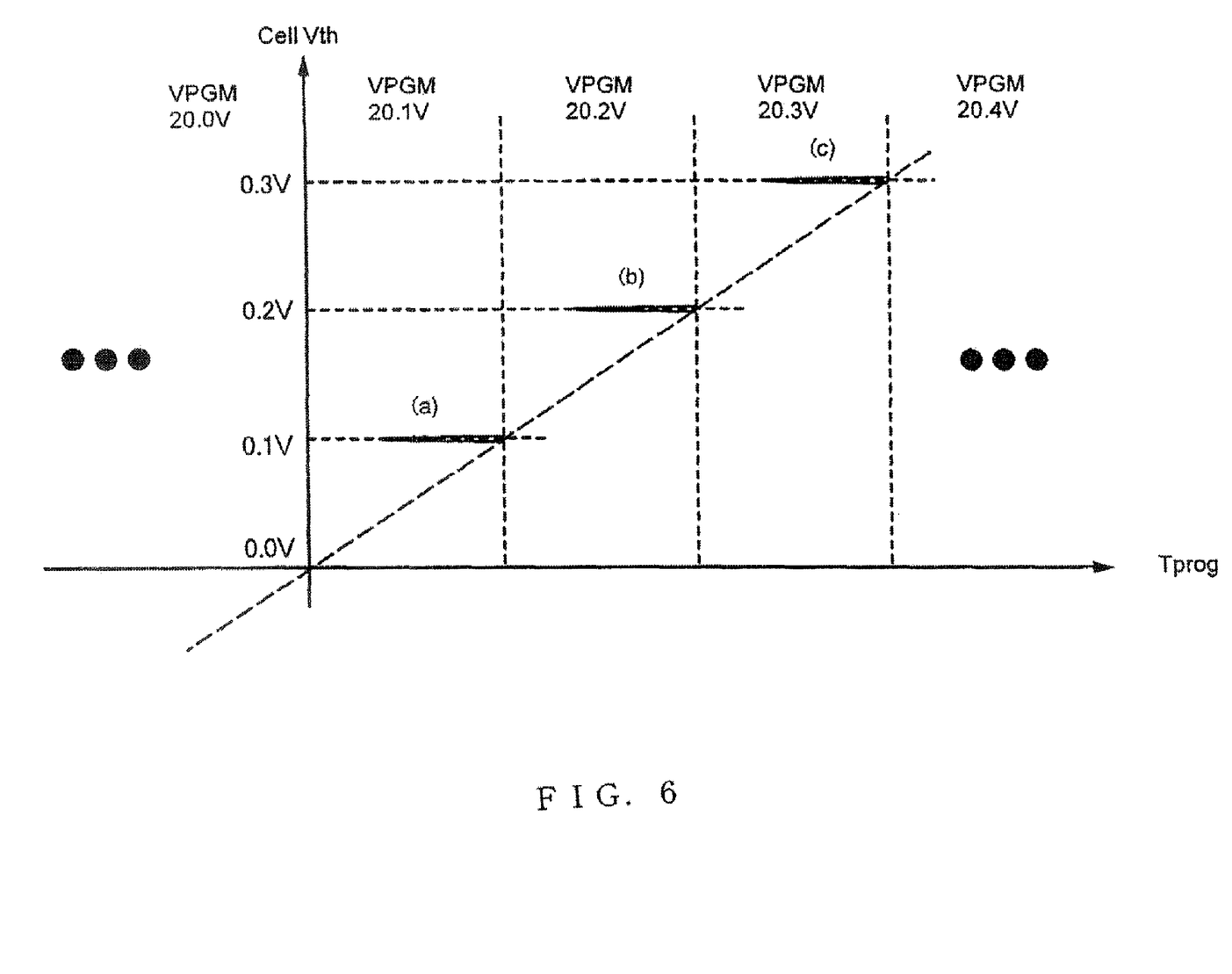
FIG. 6 is a figure showing change of the threshold Vth of the memory cell in nonvolatile semiconductor memory device of this embodiment.

In the simulation result shown in FIG. 2, when the design rule is 1Xnm, in order to fluctuate 0.1V threshold voltage, one electron should flow into the floating gate. By one program pulse (VPGM), the threshold voltage Vth of a memory cell changes 0.1V, as is shown in FIG. 6(a), (b), and (c), when program operation is performed by the stepping-up method, and the step-up width (deltaVpp) of a program pulse (VPGM) is 0.1V.

Since few electrons flow in the floating gate, where one electron should flow into the floating gate by one program pulse, for example, 0 or 2 electrons have flowed into the floating gate, variation does not occur in the threshold Vth of a memory cell, and the threshold distribution of a memory cell does not spread. Even if the program pulse VPGM is impressed one after another, adding the step-up width deltaVpp, a threshold distribution spreads and the threshold Vth of a memory cell does not.

As a result of examining in detail the simulation result shown in FIG. 2 as above, by controlling the number of the electrons flowing into the floating gate, the inventors thought that threshold voltage change of the request in a memory cell could be produced. In this embodiment, using design rule of 1Xnm, programming by the stepping-up method is performed with step-up width deltaVpp=0.1V, and the nonvolatile semiconductor memory device of this invention which can store 32 values of information in one memory cell is explained.

Figure 7:
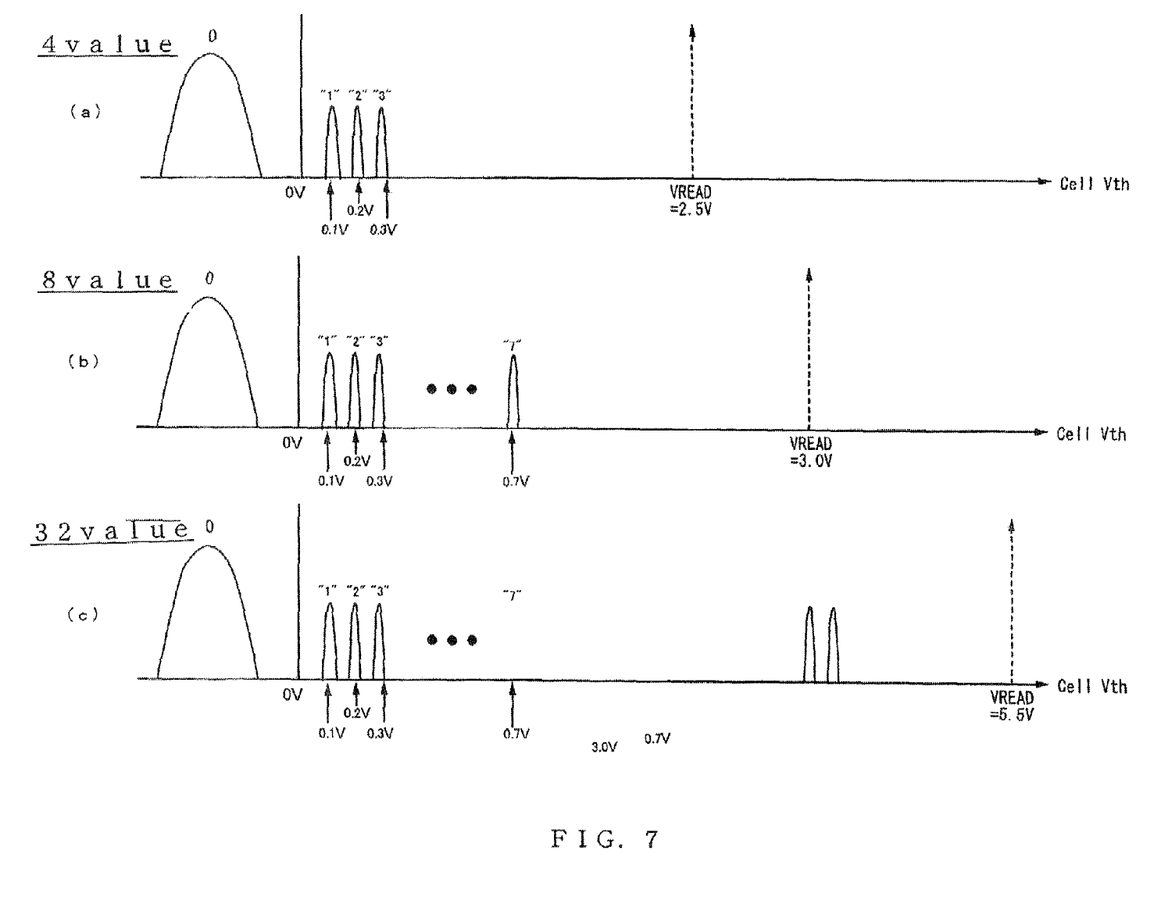
FIG. 7 is a figure showing the threshold voltage and its distribution for the memory cell according to an embodiment of the invention.

FIG. 7 is the figure showing the threshold voltage Vth and threshold voltage distribution of a memory cell in the nonvolatile semiconductor memory device of this embodiment. In order to make one memory cell store the 32 values in this embodiment, it is necessary to change a threshold voltage to 3.1V from 0V at an 0.1V interval, as shown in FIG. 7(c). In addition, in order to program four values or 8 values, FIGS. 7(a) and (b) show an example. One memory cell which varies the threshold voltage 0V to 0.3V at 0.1V interval in order to make one memory cell store the information on four values or 8 values, the example to which the threshold was changed to 0.7V from 0V at an 0.1V interval is also shown. If the simulation result shown in FIG. 2 mentioned above is taken into consideration, in order to change a threshold voltage by 0.1V, what is necessary will be just to flow one electron into the floating gate here. That means that, in this embodiment, in order to make one memory cell memorize the information on 32 values and to control the threshold of a memory cell by a 0.1V interval from 0V to 3.1V, the flow of one electron to the floating gate should be controlled. In other words, the program pulse VPGM to flow one electron into floating gate of a memory cell will be impressed.

If the simulation result of the above-mentioned FIG. 2 is taken into consideration, in order to flow one electron into the floating gate of a memory cell, it becomes controllable by impressing the program pulse VPGM by step-up width deltaVpp of 0.1V.

Figure 8:
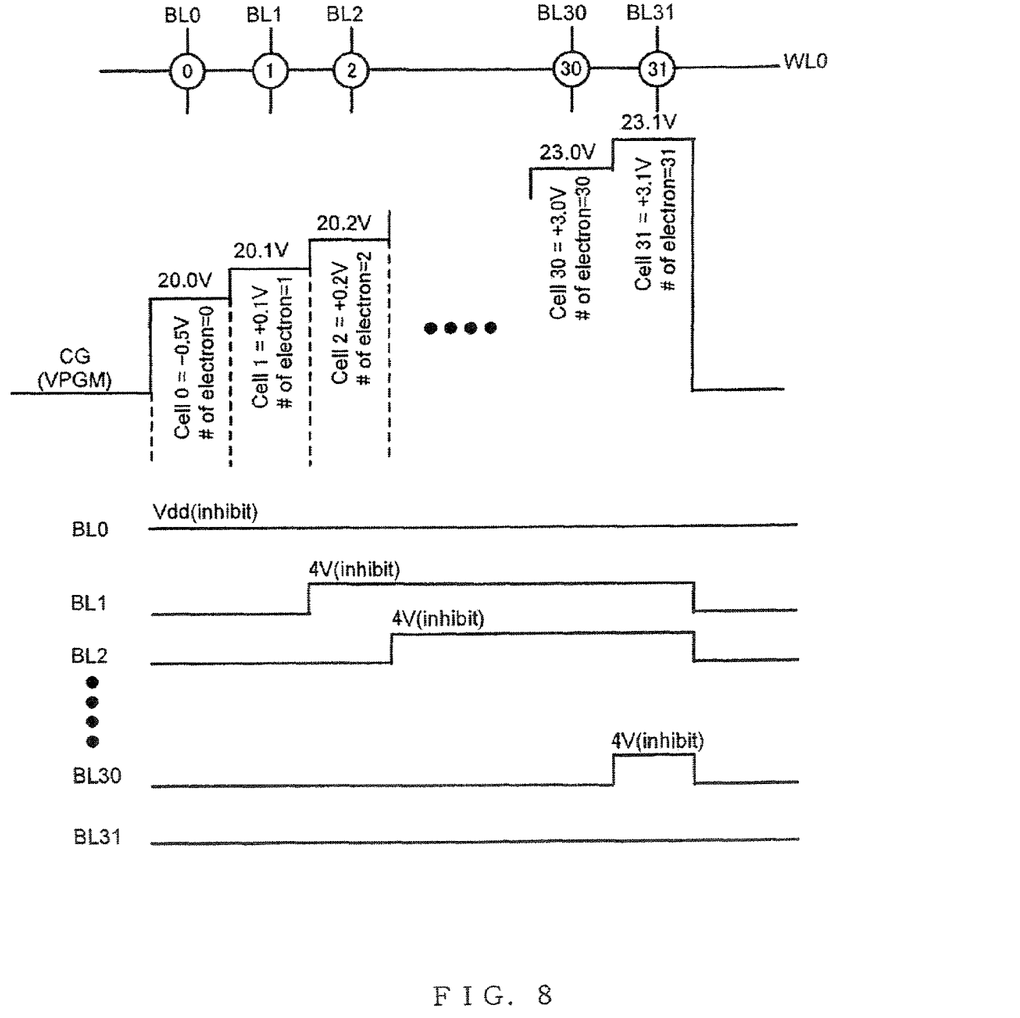
FIG. 8 is a figure showing program operation of the data according to an embodiment of the invention.

FIG. 8 shows how to write data in the memory cells M0-M31 connected to the word line WL0 of memory block of the nonvolatile semiconductor memory device in this embodiment. The upper part of FIG. 8 shows the memory cells M0-M31 with control gate (CG) connected to the word line WL0, and by which the end of a source or a drain was connected to bit lines BL0-BL31, respectively. The middle part of FIG. 8 shows the timing chart which impresses the program voltage VPGM to memory cells M0, M1-M31, respectively, in order to write "1", "2", . . . "31", making it step up by deltaVpp=0.1V.

The program voltage VPGM of 20.0V is made to step up by deltaVpp of 0.1V, and the program voltage is made to rise gradually here at the beginning of program until it is set to VPGM=3.1V. That is, since the upper limit Vthu of the change of the threshold voltage is 3.1V, deltaVth, calculated as 3.1/(32−1)=0.1V, a corresponding step-up width deltaVpp=0.1V will be impressed.

If n data should be stored in each memory cell, and the maximum value of a threshold voltage is Vthu, two or more threshold change pulses of high potential will be impressed gradually within the aperture of the voltage which produces change of the threshold of (Vthu/(n−1)) to said control gate of said memory cell.

The bottom part of FIG. 8 shows the timing chart of the signal voltage impressed to each of bit lines BL0-BL31 when programming "1", "2", . . . "31" to these memory cells M0, M1-M31, respectively. 0V is impressed to the bit line which performs program, and Vdd (program prohibition voltage: here about 4V) is impressed to the bit line to which program is inhibited. While the program voltage VPGM rises 0.1V at a time as shown in FIG. 8, it is impressed to the control gate of each of memory cells M0-M31 through a word line WL 0.

In the memory cell by which program voltage (0V) is impressed to a bit line, one electron flows into the floating gate by impression of each program voltage VPGM, and a threshold is changed. Moreover, electrons do not flow into the memory cell by impressing a program prohibition voltage (Vdd) to a bit line when each program voltage VPGM is impressed, and a threshold is not changed.

Repeating the sequence which is shown in this embodiment in the bottom part of FIG. 8, for memory cells M0, M1, and M2 . . . M30, M31, one, two, three, . . . 31 electrons will flow into the floating gates of M30 and M31 an electron, and 30 thresholds of each memory cell can be controlled as shown in FIG. 7. This program operation can be performed to all word lines.

In FIG. 8, each of memory cells M0, M1-M31, will be "1", "2", . . . "31" programmed. Although the case of the sequence concerning program operation when writing in the value of "31" is shown, it cannot be overemphasized that by making a timing change the data written in each of memory cells M0-M31 can be changed easily. Thus, in the nonvolatile semiconductor memory device of this embodiment, by controlling the electrons flowing into the floating gate of a memory cell per one electron, it becomes controllable, and the data storage of 32 values becomes possible at each memory cell.

In addition, in the embodiments above, each memory cell which stores the data of 32 values was explained. What is necessary is to control change of a threshold, according to the amount of data. The invention is not necessarily limited to this and data of multiple values, such as binary, four values, and eight values (octal) may also be used.

Figure 9:
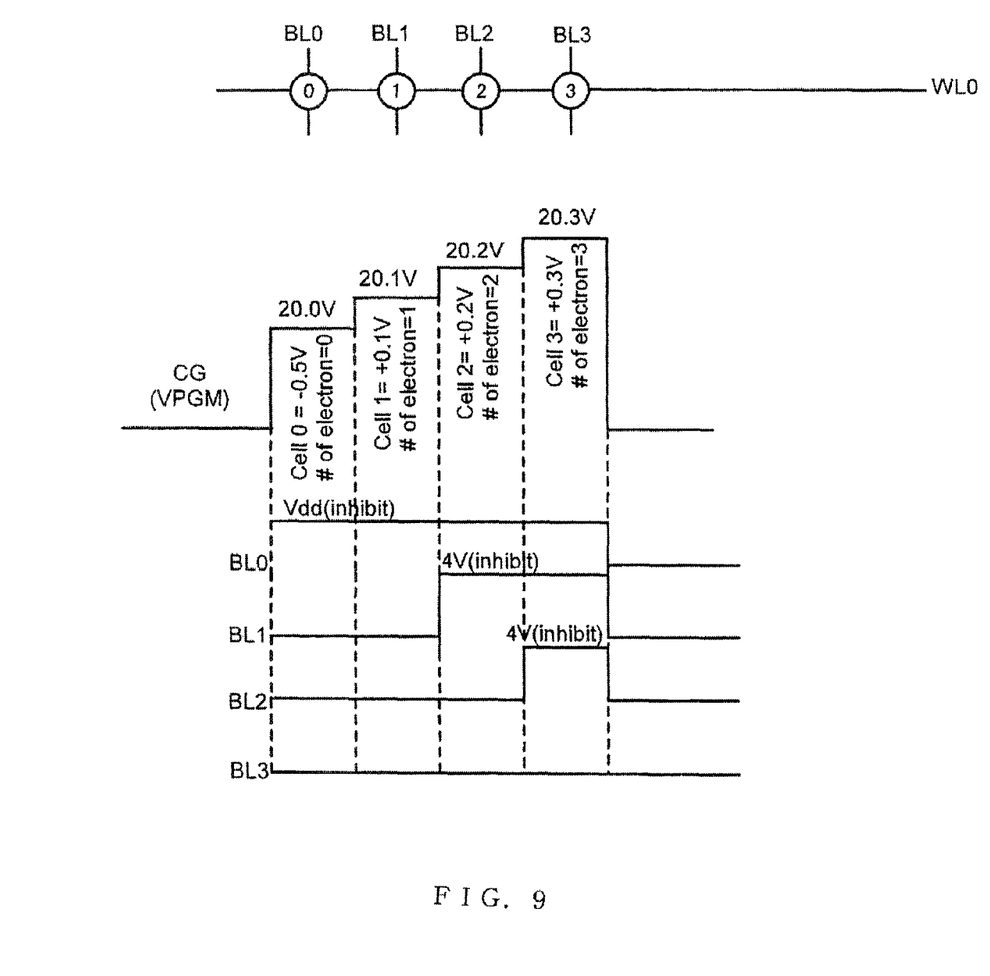
FIG. 9 is a figure showing program operation of the data according to an embodiment of the invention.
Figure 10:
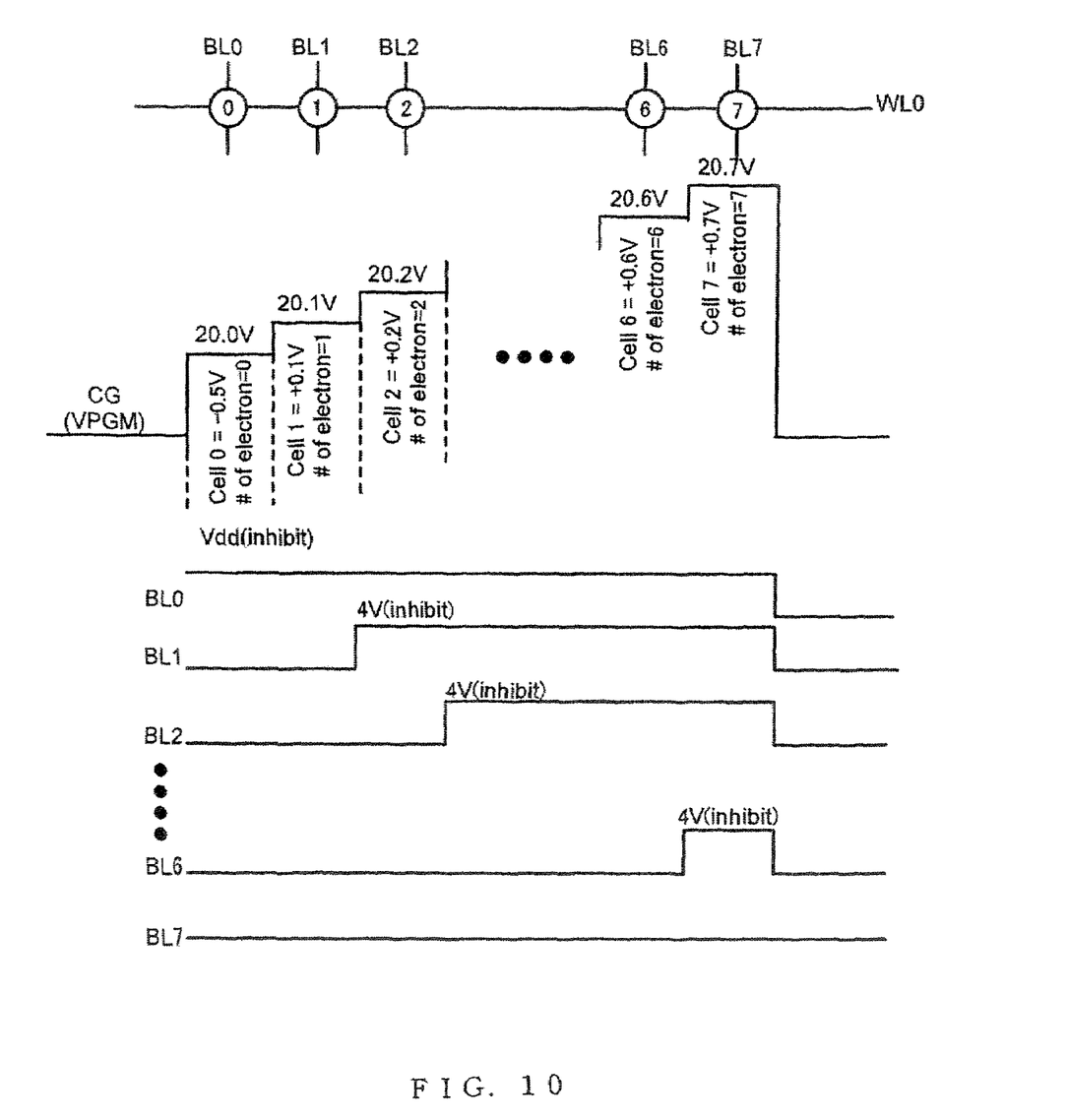
FIG. 10 is a figure showing program operation of the data according to an embodiment of the invention.

The timing chart of the signal voltage impressed to each bit lines BL0-BL7 is shown in FIG. 9 for the case where the multiple-value octal data is stored in FIG. 10 for the timing chart of the signal voltage impressed to each of bit lines BL0-BL3 in the case of making the data of the multiple value of four values memorize again.

Here, each of the parameters disclosed in FIG. 2 may differ about 20% to 40%, because the size variation of the products. For example, delta Vth /electron for 2Xnm generation may differ 40 mV-59 mV around the center value of 48.5. The cell size of the 1Xnm generation may differ about 0.00046-0.00110 square micrometer around the center value of 0.000784 square micrometer.

What is claimed is:

1. A multi-level programmable nonvolatile semiconductor memory device comprising:
   a charge accumulation layer;
   a control gate which biases a potential to the charge accumulation layer, wherein
   the potential of the charge accumulation layer is controlled to be between the interval of 85 mV and 125 mV.

2. The multi-level programmable nonvolatile semiconductor memory device according to claim 1, wherein
   the multi-level programmable nonvolatile semiconductor memory device comprises a NAND type memory cell array.

3. The multi-level programmable nonvolatile semiconductor memory device according to claim 1, wherein
   said memory device stores 32-valued data.

4. The device according to claim 3, wherein
   the device comprises a NAND type memory cell array.

5. A method of operating a multi-level programmable nonvolatile semiconductor memory device comprising:
   bias a charge accumulation layer at a first voltage;
   bias the charge accumulation layer at a second voltage higher than the first voltage,
   wherein the difference of the first voltage and the second voltage is determined by a number of electrons accumulated in the charge accumulation layer.

6. The method of operating a multi-level programmable nonvolatile semiconductor memory device according to claim 5, wherein
   the difference of the first voltage and the second voltage is between 85 mV and 125 mV.

7. The method of operating a multi-level programmable nonvolatile semiconductor memory device according to claim 5, wherein
   the difference of the first voltage and the second voltage is between 40 mV and 58 mV.

8. The method of operating a multi-level programmable nonvolatile semiconductor memory device according to claim 5, wherein
   the multi-level programmable nonvolatile semiconductor memory device comprises a NAND type memory cell array.

* * * * *